United States Patent [19]

D'Arrigo et al.

[11] Patent Number: 4,723,114
[45] Date of Patent: Feb. 2, 1988

[54] METHOD AND CIRCUIT FOR TRIMMING THE FREQUENCY OF AN OSCILLATOR

[75] Inventors: Sebastiano D'Arrigo, Houston, Tex.; Giuliano Imondi, Rieti; Sossio Vergara, Frattamaggiore, both of Italy

[73] Assignee: Texas Instruments Incorporated, Dallas, Tex.

[21] Appl. No.: 882,558

[22] Filed: Jul. 7, 1986

[51] Int. Cl.⁴ .............................................. H03K 3/02
[52] U.S. Cl. .................................... 331/111; 331/143
[58] Field of Search ............... 331/108 R, 108 D, 111, 331/143

[56] References Cited

U.S. PATENT DOCUMENTS 4,161,703 7/1979 Nutz ..................................... 331/111

Primary Examiner—Eugene R. Laroche
Assistant Examiner—Robert J. Pascal
Attorney, Agent, or Firm—John G. Graham; Rodney M. Anderson

[57] ABSTRACT

An integrated circuit oscillator which includes a capacitor, a reference current source coupled to the capacitor used to charge the latter, and a trigger circuit coupled to the capacitor having an upper input threshold for changing from a first state to a second state and a lower input threshold for changing from the second to the first state. A discharge circuit is coupled to the trigger circuit and is operative to discharge the capacitor in response to the trigger circuit changing states and to cease the discharging on changing back to its original state.

13 Claims, 3 Drawing Figures

METHOD AND CIRCUIT FOR TRIMMING THE FREQUENCY OF AN OSCILLATOR

BACKGROUND OF THE INVENTION

The present invention relates to a method and circuit for use in trimming the frequency of an oscillator which is particularly adapted for use in VLSI technology.

In fabricating oscillators on VLSI chips it is standard to fabricate a resistor and capacitor which have, in combination, an RC time constant that determines the frequency of the oscillator. Because of differences present in the fabrication process of the chips it is usually necessary to provide for some means of trimming the oscillation frequency of the oscillator. A standard approach for trimming the frequency of an oscillator is to somehow change the value of the capacitor or the resistor through which the capacitor is charged. Such a technique, however, is quite imprecise because of the parasitic impedance of the switching devices.

Accordingly, it is an object of the present invention to provide an improved circuit for trimming the frequency of oscillation of an oscillator. It is a further object to provide a circuit in which the frequency of oscillation of an oscillator can be changed more accurately than hitherto known circuits.

SUMMARY OF THE INVENTION

According to the invention there is provided an integrated circuit oscillator which includes a capacitor, a reference current source coupled to the capacitor for charging the latter and a trigger circuit coupled to the capacitor. The trigger circuit has an upper input threshold for changing from a first to a second state and a lower input threshold for changing from the second to first state. A discharge means is coupled to the trigger circuit and is operative to discharge the capacitor in response to the trigger circuit changing from the first state to the second state and to cease discharging the capacitor in response to changing from the second state to the first state.

Preferably, the oscillator includes a mirror current source coupled to the reference current source which is operative to pass a current equal to a constant factor of the reference current and a switch in series with the mirror current source operative to become conductive in response to a control signal applied thereto.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
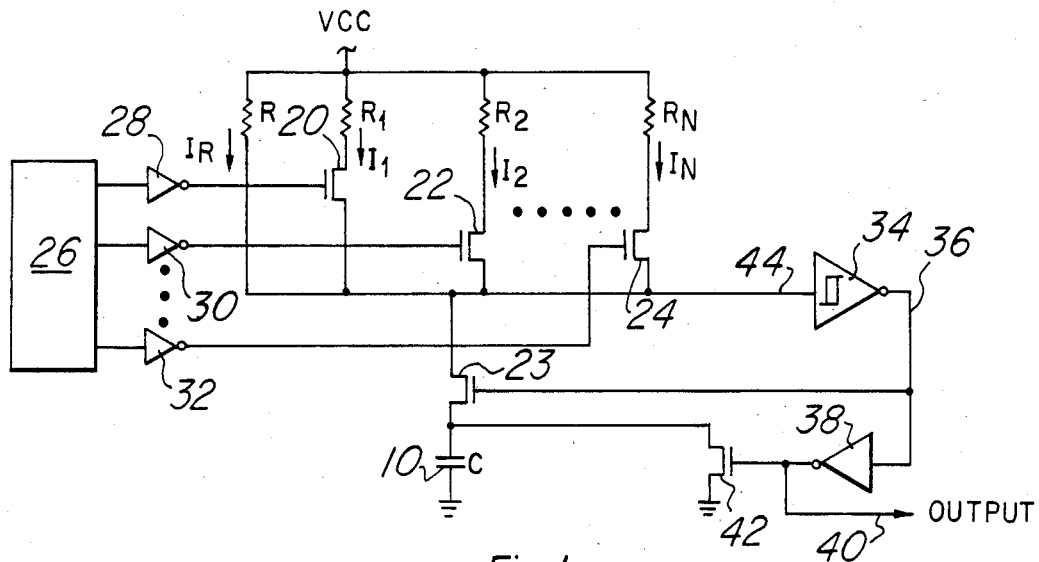
FIG. 1 is a circuit diagram of an oscillator whose frequency is trimmed by inserting resistors in parallel to charge a capacitor.

Referring to FIG. 1 there is shown a standard oscillator used in integrated circuits which consists of a primary resistor R coupled between the high voltage source $V_{cc}$ and a capacitor 10 coupled to ground. A current $I_R$ which is generated is used to charge up the capacitor 10. As a result the voltage on line 44 rises with a time constant of RC where C is the value of capacitance of capacitor 10. Line 44 is connected to the input of a Schmitt trigger circuit 34. The output of the Schmitt trigger circuit is fed to an inverter 38 which in turn drives the gate of an N-channel transistor 42 coupled across capacitor 10. The output of the inverter 38 is taken along line 40 to provide the oscillator output. When the voltage on line 44 reaches an upper input threshold of the Schmitt trigger circuit 34 the latter changes from a first state in which its output is high to one in which its output is low. Thus, the output of inverter 38 changes from low to high in response to the change in state of the Schmitt trigger circuit 34 and turns on transistor 42 while transistor 23 in series with capacitor 10 is turned off by the low output of Schmitt trigger 34 on line 36. Once the voltage on line 44 fails below a lower input threshold of the Schmitt trigger due to the discharging of capacitor 10 by transistor 42, the Schmitt trigger circuit 34 changes back from the second state to the first causing the output on line 40 to fall and transistor 42 to cease conducting.

To trim the oscillator frequency in order to adjust for process differences in its fabrication from one chip to the next a series of resistors $R_1, R_2, \ldots R_N$ are placed in parallel with resistor R but with associated switches formed by transistors 20, 22, ..., and 24, respectively, in series with the aforementioned resistors. By designing R to be too high, it is then possible to turn on any combination of switches 20, 22, ..., and 24 to insert a corresponding combination of resistors $R_1, R_2, \ldots$, and $R_N$ in parallel with resistor R and to increase the frequency of oscillation accordingly. Transistors 20, 22, ..., and 24 are turned on by a binary code converter 26 whose outputs pass through inverters 28, 30, ..., and 32 to the gates of transistors 20, 22, ..., and 24, respectively.

Figure 2:
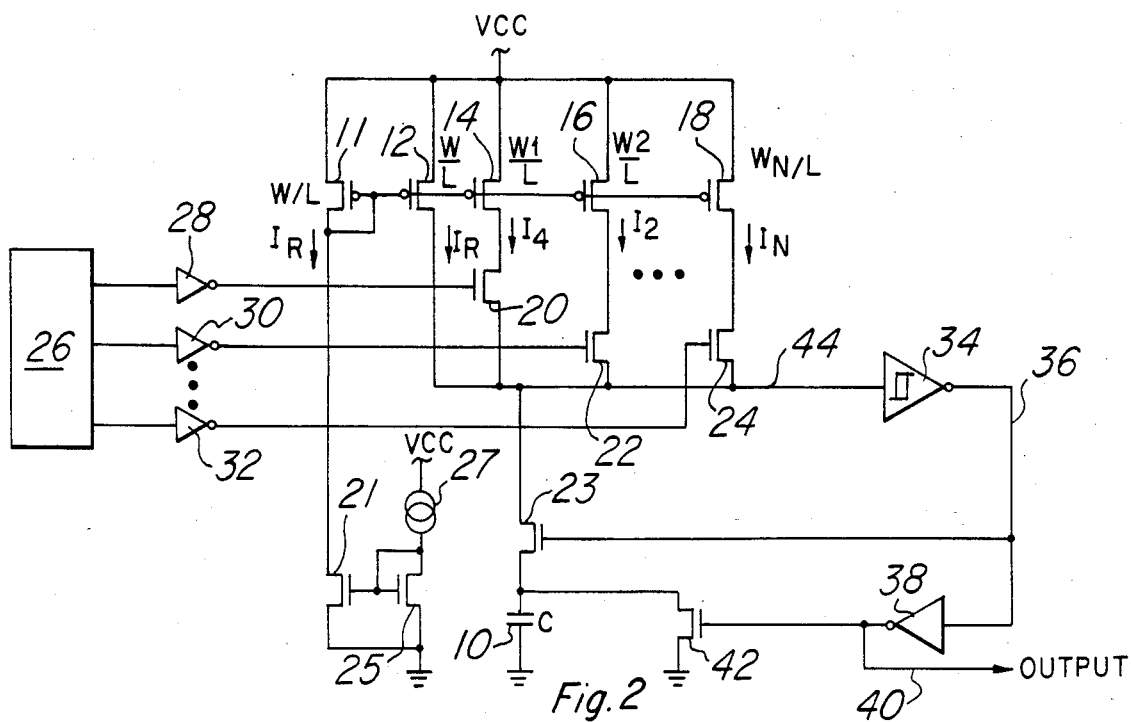
FIG. 2 is a circuit diagram of an oscillator whose frequency is trimmed or changed by inserting in parallel mirrored current sources.

An alternative approach to trimming resistor values is to trim capacitor values by placing a number of capacitors in parallel with capacitor 10. However, both of these methods are imprecise due to the parasitic impedance of the switching devices. In order to avoid the latter dependence the circuit of FIG. 2 utilizes current generators to charge capacitor 10.

A reference current $I_R$ is developed by a circuit consisting of a conventional current source 27 coupled between Vcc and drain of transistor 25. The drain of transistor 25 is coupled to its gate while its source is connected to ground. A transistor 21 whose gate is connected to the gate of transistor 25 has its drain connected to the source of P-channel transistor 11 and its source connected to ground. The gate of P-channel transistor 11 is connected to its source. Thus, current source 27 and transistor 25 establish a gate to source voltage for transistor 21 equal to the gate-to-source voltage of transistor 25 and hence a current I equal to the current through transistor 25.

Since the gates of transistors 12, 14, 16, ..., and 18 are connected to the gate of transistor 11, and their drains to Vcc, the current through each of the latter transistors is equal to the ratio of width/length for the transistor to the W/L of transistor 11. Thus, the current through transistor 12 is equal to that through transistor 11, that for transistor 14 equals W1/W that of transistor 11, that for transistor 16 equals W2/W that of transistor 11, etc. where the length of each transistor is the same. The gate control signals for transistors 20, 22, ..., and 24 are the same as those shown in FIG. 1 in which like parts are designated by the same reference numbers as those shown in FIG. 2. Thus, it is possible to set $I_1, I_2, \ldots,$ and $I_N$ by setting the values of $W_1, W_2, \ldots,$ and $W_N$, respectively, using a constant L for each transistor 12, 14, 16, ..., and 18.

Figure 3:
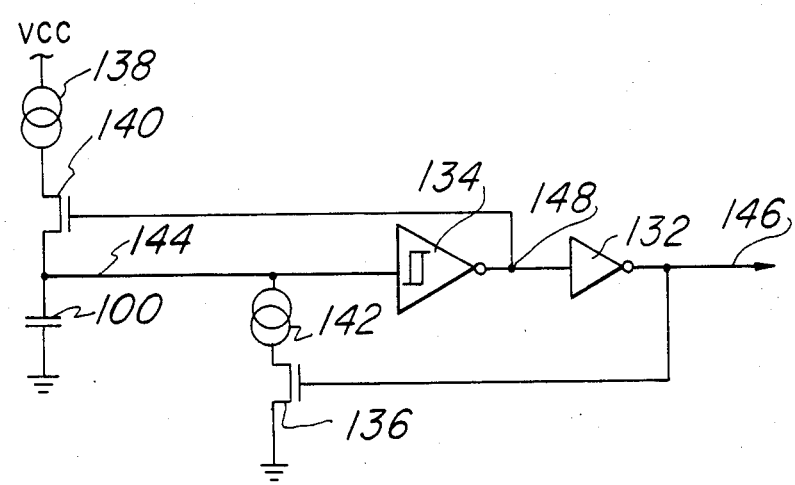
FIG. 3 is a circuit in which mirrored current sources are used not only to charge but also to discharge a capacitor.

It is obvious that by using mirrored current sources in this way it is straight forward to obtain weighted ratios for the currents through each transistor 14, 16, ..., and 18. One could for example establish a binary set of ratios by making $I_1 = 2I_R, I_2 = 4I_R, \ldots, I_N = 2^N I_R$. One could also use two current mirrors to produce a triangular waveform by the circuit shown in FIG. 3.

In this case two mirrored current sources 138 and 142 are coupled between $V_{cc}$ and line 144 and ground and line 144, respectively, through transistor switches 140 and 136, respectively. Transistor switch 140 has its gate connected to the output 148 of Schmitt trigger 134 while that of transistor 136 is connected to the output 146 of inverter 132. Thus, when the voltage on line 144 is below the upper input threshold of Schmitt trigger 134, the output on line 148 is high and transistor 140 is conducting current from current source 138 into capacitor 100. Once the voltage on line 144 reaches the upper input threshold of trigger 134, the latter changes state cutting off transistor 140 and turning on transistor 136. Now current source 142 conducts a fixed current from capacitor 100 to discharge the latter linearly so that the combined waveform on line 144 is a sawtooth depending only on the capacitance and the current values conducted by current sources 138 and 142. Although the mirrored current sources have been indicated only by the double circles, in fact they would be as in FIG. 2 with a binary translater 26 as in FIG. 2 driving the switch transistors 140 and 136 from current sources 138 and 142, respectively.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore, contemplated that the appended claims will cover any such modifications or embodiments as fall within the true scope of the invention.

What is claimed is:

1. An integrated circuit oscillator, comprising:
   a capacitor;
   a reference current source for providing a reference current;
   a mirror current source coupled to said reference current source and to said capacitor operative to charge said capacitor with a current equal to a predetermined factor of the reference current of said reference current source;
   a trigger circuit coupled to said capacitor having an upper input threshold for changing from a first state to a second state and a lower input threshold for changing from the second to the first state;
   discharge means coupled to said trigger circuit operative to discharge said capacitor in response to said trigger circuit changing from the second state to the first state.

2. An oscillator according to claim 1, wherein said trigger circuit is a Schmitt trigger circuit and said discharge means is a transistor having a source to drain path coupled across said capacitor and a gate coupled to an output of said Schmitt trigger circuit.

3. An oscillator according to claim 2, including a capacitor switch in series with said capacitor operative to open and shut off charging current to said capacitor in response to said trigger circuit changing from the second to the first state.

4. An oscillator according to claim 1, wherein said reference current source is a P-channel transistor whose gate is coupled to its source, its source to a constant current and its drain to a high voltage source $V_{cc}$.

5. An integrated circuit oscillator, comprising:
   a capacitor;
   a reference current source for providing a predetermined current;
   a trigger circuit coupled to said capacitor having an upper input threshold for changing from a first state to a second state and a lower input threshold for changing from the second to the first state;
   discharge means coupled to said trigger circuit operative to discharge said capacitor in response to said trigger circuit changing from the first state to the second state and to cease discharging said capacitor in response to changing from the second state to the first state;
   a mirror current source coupled to said reference current source and to said capacitor and operative to pass a current equal to a predetermined factor of said reference current; and
   a switch in series with said mirror current source operative to become conductive in response to a control signal applied thereto.

6. An oscillator according to claim 5, wherein said trigger circuit is a Schmitt trigger circuit.

7. An oscillator according to claim 5, wherein said discharge means is a transistor connected across said capacitor operative to turn on in response to a binary translator control signal applied to its gate.

8. An oscillator according to claim 5, wherein said reference current source is a P-channel reference transistor having a drain connected to high voltage source $V_{cc}$, a gate connected to its source and its source coupled to a constant current source.

9. An oscillator according to claim 8, wherein mirror current source is a P-channel transistor whose gate is coupled to the gate of said reference transistor, whose drain is connected to $V_{cc}$ and whose source is connected to said switch.

10. An oscillator according to claim 9, wherein said switch is an N-channel transistor having a source to drain path coupled between the source of said mirror current transistor and said capacitor.

11. An oscillator according to claim 5, wherein said discharge means is a discharge current source in series with a discharge switch coupled across said capacitor and operative to become conductive in response to said trigger circuit changing from the first state to the second state.

12. An oscillator according to claim 6, wherein said Schmitt trigger is inverting and an output of the latter is coupled to an inverter with the inverter output coupled to a gate of discharge transistor which discharges said capacitor on becoming conductive.

13. A method of controlling the frequency of an oscillator, comprising:

charging a capacitor with a primary current source;

applying the voltage to which said capacitor is being charged to an input of a Schmitt trigger circuit having an upper input threshold and a lower input threshold and operative to change from a first state to a second state in response to the voltage at its input exceeding said upper input threshold and to change from the second state to the first state in response to the voltage at its input falling below said lower input threshold;

charging said capacitor with a mirror current source connected in parallel with said primary current source, said mirror current source providing a current of a selectable value, so that the time required to charge said capacitor to the voltage of said upper input threshold is adjusted; and applying the output of said Schmitt trigger to a discharge transistor coupled across said capacitor so as to become conductive upon said Schmitt trigger switching from said first to said second state.

* * * * *